(12) United States Patent
Ker et al.

(10) Patent No.: US 7,889,470 B2
(45) Date of Patent: Feb. 15, 2011

(54) ESD PROTECTION CIRCUIT WITH ACTIVE TRIGGERING

(75) Inventors: Ming-Dou Ker, Hsinchu (TW); Yuan-Wen Hsiao, Taichung (TW); Ryan Hsin-Chin Jiang, Taipei (TW)

(73) Assignee: Amazing Microelectronic Corp., Jhonghe, Taipei (TW)

( * ) Notice: Subject to any disclaimer, the term of this patent is extended or adjusted under 35 U.S.C. 154(b) by 0 days.

(21) Appl. No.: 12/656,495

(22) Filed: Feb. 1, 2010

(65) Prior Publication Data

US 2010/0142107 A1  Jun. 10, 2010

Related U.S. Application Data

(62) Division of application No. 11/826,634, filed on Jul. 17, 2007, now Pat. No. 7,656,627.

(51) Int. Cl.
*H02H 9/00*  (2006.01)
(52) U.S. Cl. .................. 361/56; 361/91.1; 361/111
(58) Field of Classification Search .................. 361/56, 361/91.1, 111
See application file for complete search history.

(56) References Cited

U.S. PATENT DOCUMENTS

| | | | |
|---|---|---|---|
| 5,991,135 A | 11/1999 | Saleh | |
| 6,144,542 A | 11/2000 | Ker et al. | |
| 7,098,511 B2 | 8/2006 | Ker et al. | |
| 7,411,767 B2 | 8/2008 | Huang et al. | |
| 7,463,466 B2 | 12/2008 | Hsueh et al. | |
| 2003/0151877 A1 | 8/2003 | Young et al. | |
| 2004/0136126 A1 | 7/2004 | Smith | |
| 2006/0028776 A1* | 2/2006 | Stockinger et al. | 361/56 |
| 2007/0018193 A1 | 1/2007 | Ker et al. | |
| 2007/0097581 A1* | 5/2007 | Khazhinsky et al. | 361/111 |
| 2007/0109698 A1 | 5/2007 | Kim | |
| 2007/0201173 A1 | 8/2007 | Chu et al. | |
| 2009/0067104 A1 | 3/2009 | Stockinger et al. | |

* cited by examiner

*Primary Examiner*—Jared J Fureman
*Assistant Examiner*—Christopher J Clark
(74) *Attorney, Agent, or Firm*—Stites & Harbison, PLLC; Juan Carlos A. Marquez, Esq (57) ABSTRACT

An ESD protection circuit is provided. The circuit includes a discharging component, a diode, and an ESD detection circuit. The discharging component is coupled between an input/output pad and a first power line of an IC. The diode is coupled between the input/output pad and a second power line of the IC in a forward direction toward the second power line. The ESD detection circuit includes a capacitor, a resistor, and a triggering component. The capacitor and the resistor are formed in series and coupled between the first power line and the second power line. The triggering component has a positive power end coupled to the input/output pad and a negative power end coupled to the first power line. An input of the triggering component is coupled to a node between the capacitor and the resistor.

3 Claims, 8 Drawing Sheets

ESD PROTECTION CIRCUIT WITH ACTIVE TRIGGERING

CROSS-REFERENCE TO RELATED APPLICATION

This application is a divisional of U.S. application Ser. No. 11/826,634 filed on Jul. 17, 2007 now U.S. Pat. No. 7,656,627. This application claims priority to U.S. application Ser. No. 11/826,634 filed on Jul. 17, 2007, which is incorporated by reference.

BACKGROUND OF THE INVENTION

1. Field of the Invention

The present invention relates to an electrostatic discharge (ESD) protection circuit. In particular, the present invention relates to an ESD protection circuit suitable for applying in an integrated circuit (IC).

2. Description of the Prior Art

As the scale of devices in ICs has become smaller, the devices have become more vulnerable to Electrostatic discharge (ESD). Hence, ESD has been one of the most important reliability issues for IC products and must be taken into consideration in the design phase of all ICs.

Besides an ESD clamp device, an ESD detection circuit is another critical component in on-chip ESD protection circuits because it highly relates to the ESD protection capability of an on-chip ESD protection circuit. The ESD detection circuit is designed to provide trigger currents to turn on the ESD clamp device when the IC product is under ESD stresses.

Figure 1:
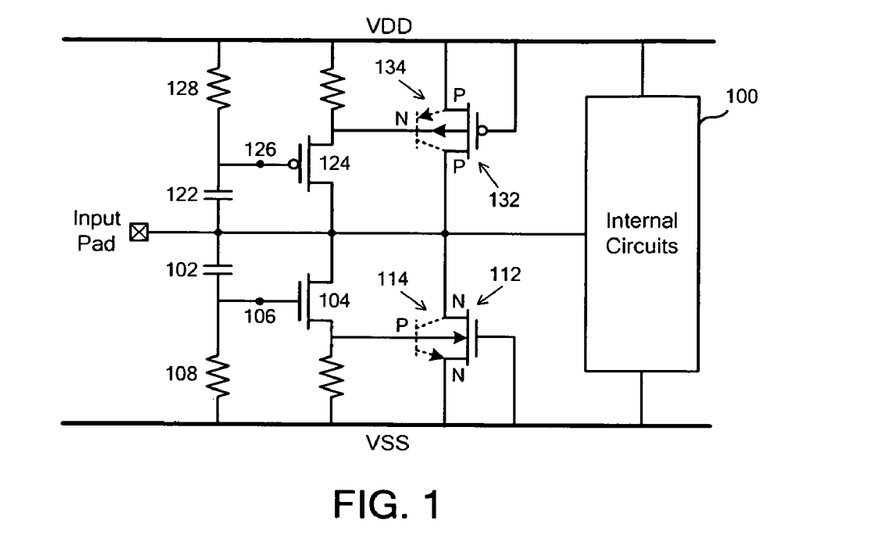
FIG. 1 through FIG. 6 show several traditional circuits disclosed in prior arts.

A variety of ESD detection circuits were proposed. FIG. 1 illustrates an ESD protection circuit for input pads proposed in the U.S. Pat. No. 6,465,768. Generally, ESD occurs when one pin of an IC is grounded and another pin of the IC contacts an electrostatically pre-charged object. For instance, under positive-to-VSS (PS-mode) ESD stresses, a positive ESD zapping is applied to the input pad in FIG. 1 while the VSS power rail is grounded and the VDD power rail is floating.

Under PS-mode ESD stresses, the positive ESD voltage pulse at the input pad is coupled through the capacitor 102 to the gate terminal 106 of the NMOS 104. When the coupled voltage at the gate terminal 106 of NMOS 104 is greater than the threshold voltage of NMOS 104, NMOS 104 is turned on to conduct some ESD currents from the stressed input pad to the base terminal of the parasitic NPN BJT 114 in NMOS 112, which is formed by the N+ diffusion, P-well region, and N+ diffusion.

With the trigger current injected to the base terminal of the parasitic NPN BJT 114 in NMOS 212, NMOS 212 is turned on to discharge ESD current from the input pad to VSS power rail, and the internal circuit 100 can be protected from being damaged by ESD currents.

Under negative-to-VDD (ND-mode) ESD stresses, the negative ESD zapping is applied to the input pad while the VDD power rail is grounded and the VSS power rail is floating. Under ND-mode ESD stresses, the negative ESD voltage pulse at the input pad is coupled through the capacitor 122 to the gate terminal 126 of the PMOS 124. With the coupled voltage at the gate terminal 126 of PMOS 124, PMOS 124 is turned on to conduct some ESD current from the stressed input pad to the base terminal of the parasitic PNP BJT 134 in PMOS 132, which is formed by the P+ diffusion, N-well region, and P+ diffusion. With the trigger current injected to the base terminal of the parasitic PNP BJT 134 in PMOS 132, PMOS 132 is turned on to discharge ESD current from the input pad to VDD power rail.

Under positive-to-VDD (PD-mode) ESD stresses, the positive ESD zapping is applied to the input pad while the VDD power rail is grounded and the VSS power rail is floating. Under PD-mode ESD stresses, the parasitic diode formed by the P+ drain diffusion and N-well in PMOS 132 is forward-biased to discharge ESD currents from the input pad to VDD power rail.

Under negative-to-VSS (NS-mode) ESD stresses, the negative ESD zapping is applied to the input pad while the VSS power rail is grounded and the VDD power rail is floating. Under NS-mode ESD stresses, the parasitic diode formed by the N+ drain diffusion and P-well in NMOS 112 is forward-biased to discharge ESD currents from the input pad to VSS power rail.

Figure 2:
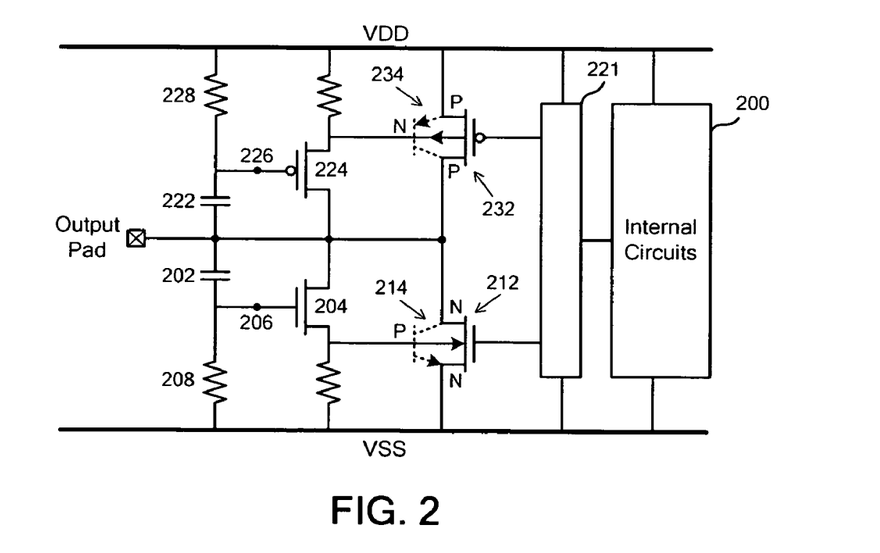

The same concept can be applied to ESD protection design for an output pad, which is shown in FIG. 2. In FIG. 1, the gate terminals of PMOS 132 and NMOS 112 are connected to VDD and VSS, respectively. However, the gate terminals of PMOS 232 and NMOS 212 are connected to the pre-driving circuit 221 in FIG. 2.

Figure 3:
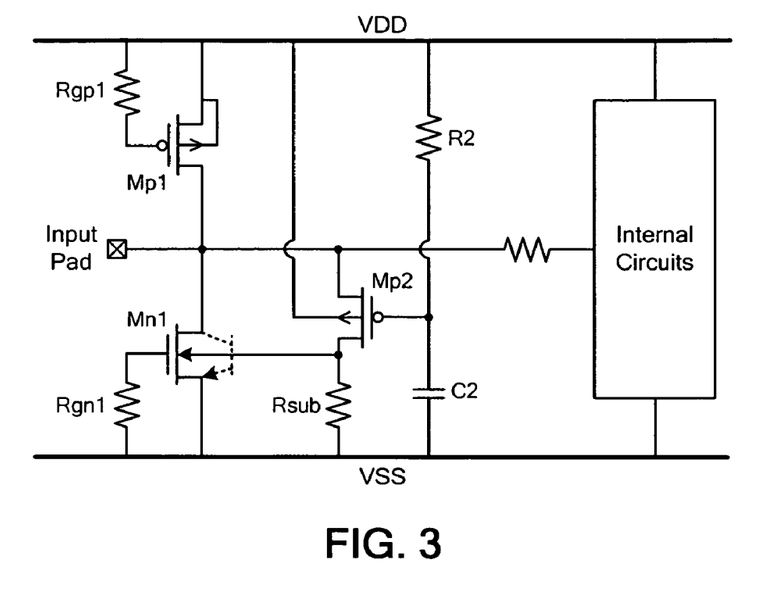
Figure 4:
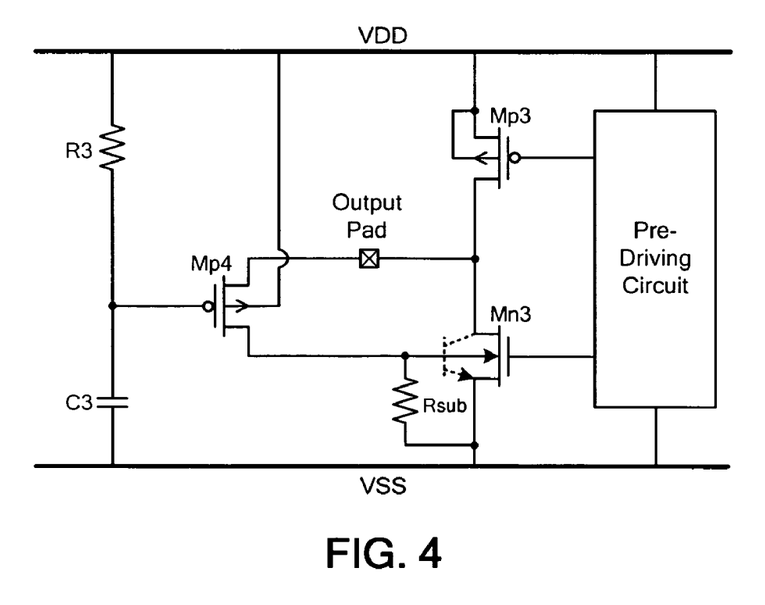

FIG. 3 and FIG. 4 illustrate another ESD protection design proposed in "ESD protection design in a 0.18-µm salicide CMOS technology by using substrate-triggered technique" reported by M.-D. Ker, T.-Y. Chen, and C.-Y. Wu in Proc. IEEE International Symposium on Circuits and Systems (IS-CAS), 2001, pp. 754-757.

The ESD protection circuit for an input pad is shown in FIG. 3. Under PS-mode ESD stresses, a positive ESD voltage is coupled from the input pad to the floating VDD power rail. Since the capacitor C2 is connected to the grounded VSS power rail, the gate voltage of PMOS Mp2 is initially low enough to turn on Mp2. With the drain current of Mp2 injected into the P-well region of NMOS Mn1, the parasitic NPN BJT (formed by N+ drain diffusion, P-well region, and N+ source diffusion) in Mn1 is turned on to discharge ESD current from the input pad to the VSS power rail. On the other side, under NS-mode ESD stresses, the diode formed by the P-well and N+ drain diffusion in Mn1 is forward-biased to provide ESD protection.

The ESD protection circuit for an output pad is shown in FIG. 4. The gate terminals of ESD clamp devices Mp3 and Mn3 can be driven by a pre-driving circuit. Thus, Mp3 and Mn3 can simultaneously act as an output driver and ESD protection devices. Under PS-mode ESD stresses, a positive ESD voltage is coupled from the output pad to the floating VDD power rail. Since the capacitor C3 is connected to grounded VSS power rail, the gate voltage of PMOS Mp4 is initially low enough to turn on Mp4. With the drain current of Mp4 injected into the P-well region of NMOS Mn3, the parasitic NPN BJT (formed by N+ drain diffusion, P-well region, and N+ source diffusion) in Mn3 is turned on to discharge ESD current from the output pad to the VSS power rail. On the other side, under NS-mode ESD stresses, the diode formed by the P-well and N+ drain diffusion in Mn3 is forward-biased to provide ESD protection.

Figure 5:
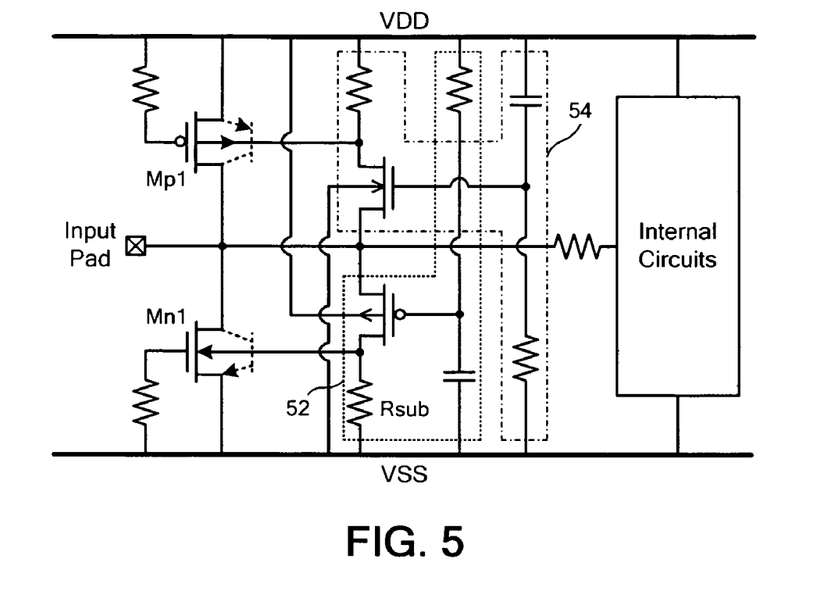

With the trigger circuits for both PMOS and NMOS transistors, another ESD protection circuit for an input pad proposed in the U.S. Pat. No. 6,566,715 is shown in FIG. 5. The ESD detection circuit 52 is designed to provide trigger current to turn on the parasitic NPN BJT in Mn1 under PS-mode ESD stresses. Similarly, the ESD detection circuit 54 is designed to provide trigger current to turn on the parasitic PNP BJT in Mp1 under ND-mode ESD stresses.

Figure 6:
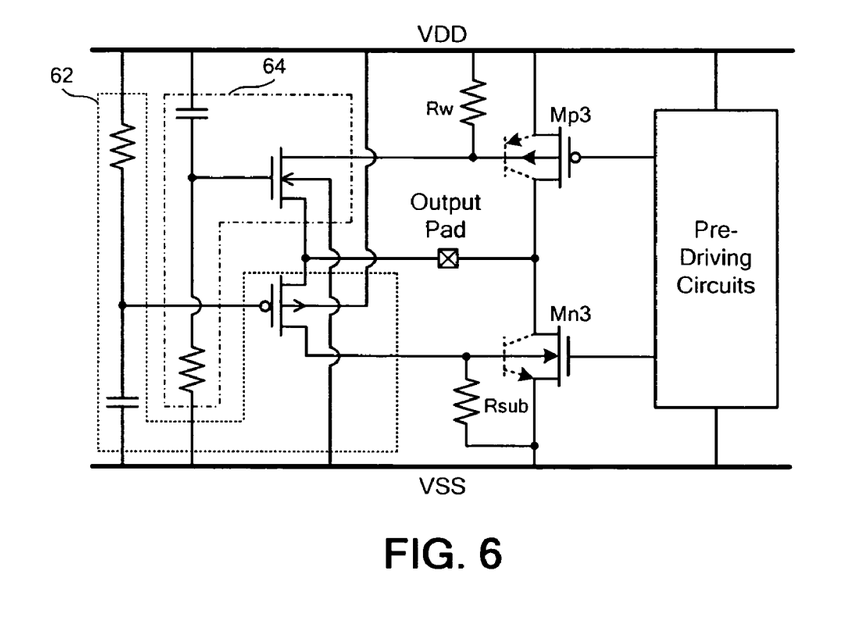

The ESD protection design for an output pad with ESD detection circuits including both PMOS and NMOS transistors is shown in FIG. 6. The ESD detection circuit 80 is designed to provide trigger current to turn on the parasitic BJT in Mn3 under PS-mode ESD stresses. The ESD detection circuit 82 is designed to provide trigger current to turn on the parasitic BJT in Mp3 under ND-mode ESD stresses.

SUMMARY OF THE INVENTION

The invention provides several new ESD protection circuits. The first embodiment according to the invention is an ESD protection circuit including a discharging component, a diode, and an ESD detection circuit. The discharging component is coupled between an input/output pad and a first power line of an IC. The diode is coupled between the input/output pad and a second power line of the IC in a forward direction toward the second power line.

The ESD detection circuit includes a capacitor, a resistor, and a triggering component. The capacitor and the resistor are formed in series between the first power line and the second power line. The triggering component has a positive power end coupled to the input/output pad and a negative power end coupled to the first power line. An input of the triggering component is coupled to a node between the capacitor and the resistor. The discharging component is turned off during normal power operations and triggered by an output of the triggering component in an ESD event.

The second embodiment according to the invention is an ESD protection circuit including a discharging component, a diode, and an ESD detection circuit. The discharging component is coupled between an input/output pad and a first power line of an IC. The diode is coupled between the input/output pad and a second power line of the IC in a forward direction toward the input/output pad.

The ESD detection circuit includes a capacitor, a resistor, and a triggering component. The capacitor and the resistor are formed in series between the first power line and the second power line. The triggering component has a positive power end coupled to the first power line and a negative power end coupled to the input/output pad. An input of the triggering component is coupled to a node between the capacitor and the resistor. The discharging component is turned off during normal power operations and triggered by an output of the triggering component in an ESD event.

The third embodiment according to the invention is an ESD protection circuit including a first discharging component, a second discharging component, and an ESD detection circuit. The first discharging component is coupled between an input/output pad and a first power line of an IC. The second discharging component is coupled between the input/output pad and a second power line of the IC.

The ESD detection circuit includes a capacitor, a resistor, a first triggering component, and a second triggering component. The capacitor and the resistor are formed in series between the first power line and the second power line. The first triggering component has a first positive power end coupled to the input/output pad and a first negative power end coupled to the first power line. A first input of the first triggering component is coupled to a node between the capacitor and the resistor. The second triggering component has a second positive power end coupled to the second power line and a second negative power end coupled to the input/output pad. A second input of the second triggering component is coupled to the node between the capacitor and the resistor.

The first and the second discharging components are turned off during normal power operations. The first discharging component is triggered by a first output of the first triggering component during a first ESD event, and the second discharging component is triggered by a second output of the second triggering component during a second ESD event.

The fourth embodiment according to the invention is an ESD protection circuit including a discharging component, a first diode, a second diode, and an ESD detection circuit. The discharging component is coupled between an input/output pad and a first power line of an IC. The first diode is coupled between the input/output pad and an ESD bus in a forward direction toward the ESD bus. The second diode is coupled between the ESD bus and a second power line of the IC in a forward direction toward the ESD bus.

The ESD detection circuit includes a capacitor, a resistor, and a triggering component. The capacitor and the resistor are formed in series between the first power line and the second power line. The triggering component has a positive power end coupled to the ESD bus and a negative power end coupled to the first power line. An input of the triggering component is coupled to a node between the capacitor and the resistor. The discharging component is turned off during normal power operations, and triggered by an output of the triggering component in an ESD event.

The fifth embodiment according to the invention is an ESD protection circuit including a discharging component, a first diode, a second diode, and an ESD detection circuit. The discharging component is coupled between an input/output pad and a first power line of an IC. The first diode is coupled between the input/output pad and an ESD bus in a forward direction toward the input/output pad. The second diode is coupled between the ESD bus and a second power line of the IC in a forward direction toward the second power line.

The ESD detection circuit includes a capacitor, a resistor, and a triggering component. The capacitor and the resistor are formed in series between the first power line and the second power line. The triggering component has a positive power end coupled to the first power line and a negative power end coupled to the ESD bus. An input of the triggering component is coupled to a node between the capacitor and the resistor. The discharging component is turned off during normal power operations, and triggered by an output of the triggering component in an ESD event.

The sixth embodiment according to the invention is an ESD protection circuit including a first discharging component, a second discharging component, a first diode, a second diode, a third diode, a fourth diode, and an ESD detection circuit.

The first discharging component is coupled between an input/output pad and a first power line of an IC. The second discharging component is coupled between the input/output pad and a second power line of the IC. The first diode is coupled between the input/output pad and a first ESD bus in a forward direction toward the first ESD bus. The second diode is coupled between the first ESD bus and the second power line in a forward direction toward the first ESD bus. The third diode is coupled between the input/output pad and a second ESD bus in a forward direction toward the input/output pad. The fourth diode is coupled between the second ESD bus and the second power line in a forward direction toward the second power line.

The ESD detection circuit includes a capacitor, a resistor, a first triggering component, and a second triggering component. The first triggering component has a first positive power end coupled to the first ESD bus and a first negative power end coupled to the first power line. A first input of the first triggering component is coupled to a node between the capacitor and the resistor. The second triggering component has a second positive power end coupled to the second power line and a second negative power end coupled to the second ESD bus. A second input of the second triggering component is coupled to the node between the capacitor and the resistor.

The first and the second discharging components are turned off during normal power operations. The first discharging component is triggered by a first output of the first triggering component during a first ESD event, and the second discharging component is triggered by a second output of the second triggering component in a second ESD event.

The advantage and spirit of the invention may be understood by the following recitations together with the appended drawings.

DETAILED DESCRIPTION OF THE INVENTION

Figure 7:
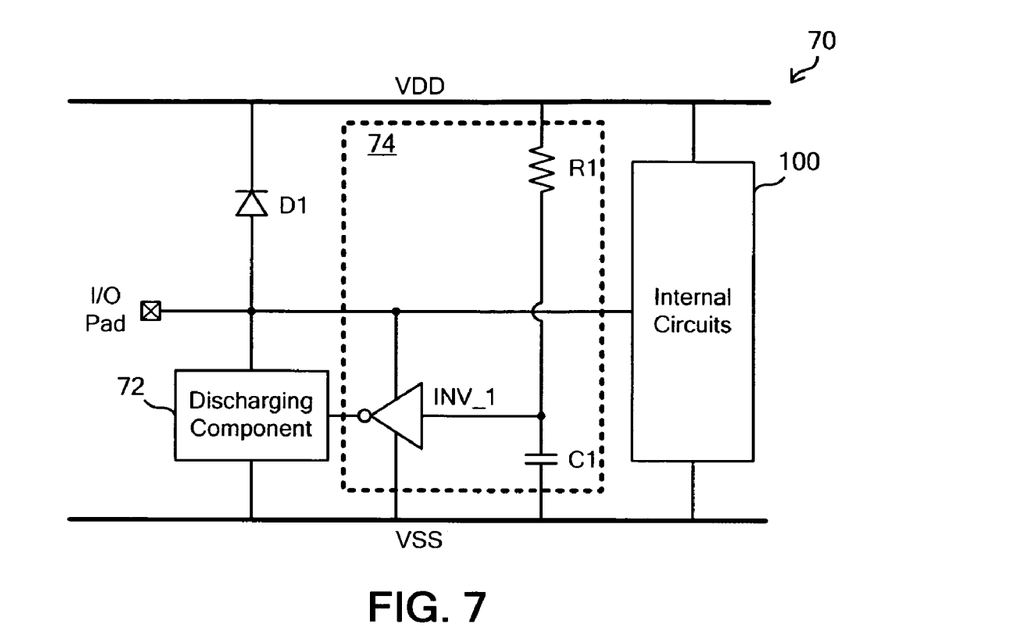
FIG. 7 illustrates the ESD protection circuit in the first embodiment according to the invention.

Please refer to FIG. 7, which illustrates the ESD protection circuit in the first embodiment according to the invention. This ESD protection circuit 70 includes a discharging component 72, a diode D1, and an ESD detection circuit 74. The discharging component 72 is coupled between an input/output pad and a first power line (VSS) of the IC in which the ESD protection circuit 70 is set. The diode D1 is coupled between the input/output pad and a second power line (VDD) of the IC in a forward direction toward the second power line.

The ESD detection circuit 74 includes a resistor R1, a capacitor C1, and a triggering component. In this embodiment, the triggering component is an inverter labeled as INV_1. The resistor R1 and the capacitor C1 are formed in series and coupled between the first power line and the second power line. As shown in FIG. 7, the inverter INV_1 has a positive power end coupled to the input/output pad and a negative power end coupled to the first power line. The input of the inverter INV_1 is coupled to the node between the capacitor C1 and the resistor R1. The output of the inverter INV_1 is coupled to the discharging component 72.

Figure 9:
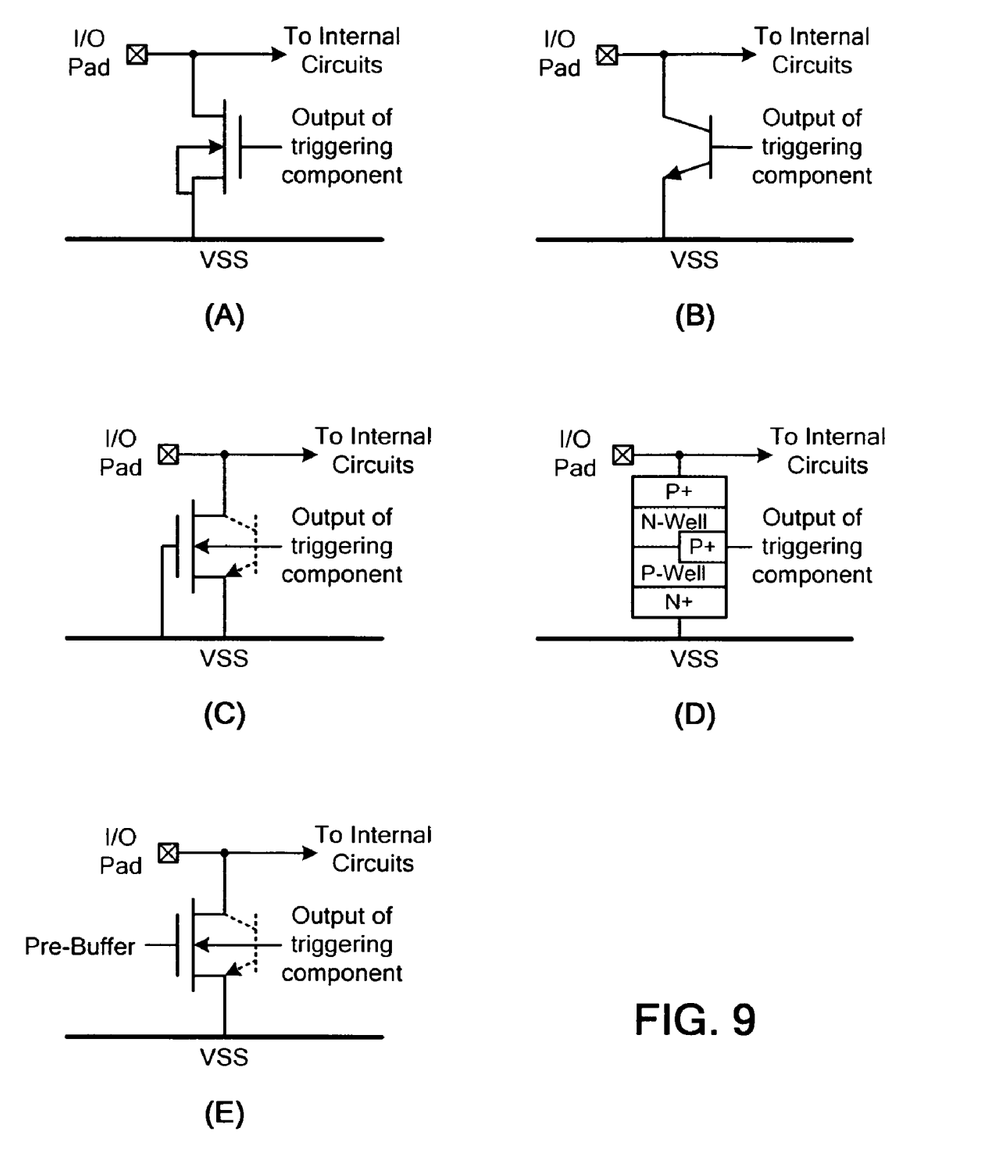
FIG. 9 illustrates several applicable examples of the discharging component coupled between an I/O pad and the VDD power rail.

FIG. 9 illustrates several applicable examples of the discharging component 72. In actual applications, the discharging component 72 can be a gate-driven NMOS in FIG. 9(A), an NPN BJT in FIG. 9(B), a gate-grounded NMOS in FIG. 9(C), a P-type substrate-triggered SCR in FIG. 9(D), or an NMOS with its gate terminal coupled to a pre-buffer in FIG. 9(E).

During normal power operations of the internal circuits 100, the discharging component 72 is turned off. Under PD-mode ESD stresses, the diode D1 is forward-biased to discharge ESD currents from the input/output pad to the second power line. Under PS-mode ESD stresses, the RC-delay caused by R1 and C1 turns on the PMOS in the inverter INV_1. Thus, the discharging component 72 can be turned on by the output current of output voltage of INV_1. Thereby, the ESD current is discharged from the input/output pad to the first power line, and the internal circuit 100 can be protected from being damaged by ESD.

In actual applications, the triggering component can also be an M-input NAND with all inputs coupled together or an N-input NOR with all inputs coupled together, wherein M and N are both positive integers larger than 1, respectively.

Figure 8:
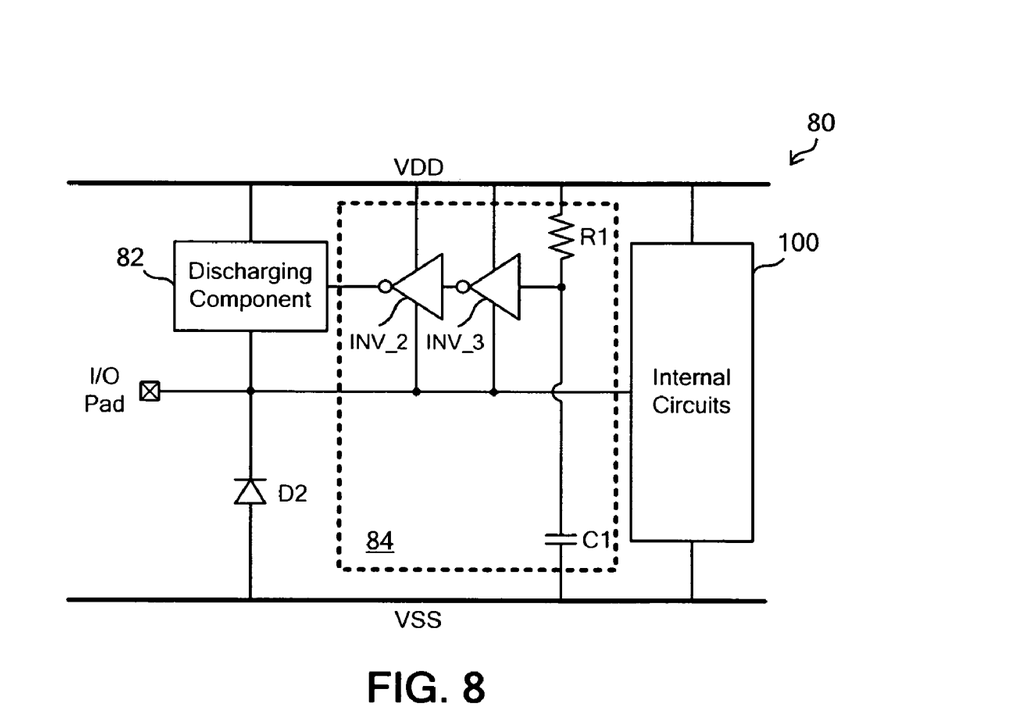
FIG. 8 illustrates the ESD protection circuit in the second embodiment according to the invention.

Please refer to FIG. 8, which illustrates the ESD protection circuit in the second embodiment according to the invention. This ESD protection circuit 80 includes a discharging component 82, a diode, and an ESD detection circuit 84. The discharging component 82 is coupled between an input/output pad and a first power line (VDD) of an IC. The diode is coupled between the input/output pad and a second power line (VSS) of the IC in a forward direction toward the input/output pad.

The ESD detection circuit 84 includes a capacitor C1, a resistor R1, and a triggering component. In this embodiment, the triggering component is composed of two inverters, INV_2 and INV_3, coupled in series. The capacitor C1 and resistor R1 are formed in series between the first power line and the second power line. As shown in FIG. 8, the inverters respectively have a positive power end coupled to the first power line and a negative power end coupled to the input/output pad. Besides, the input of the inverter INV_3 is coupled to the node between the capacitor C1 and resistor R1.

Figure 10:
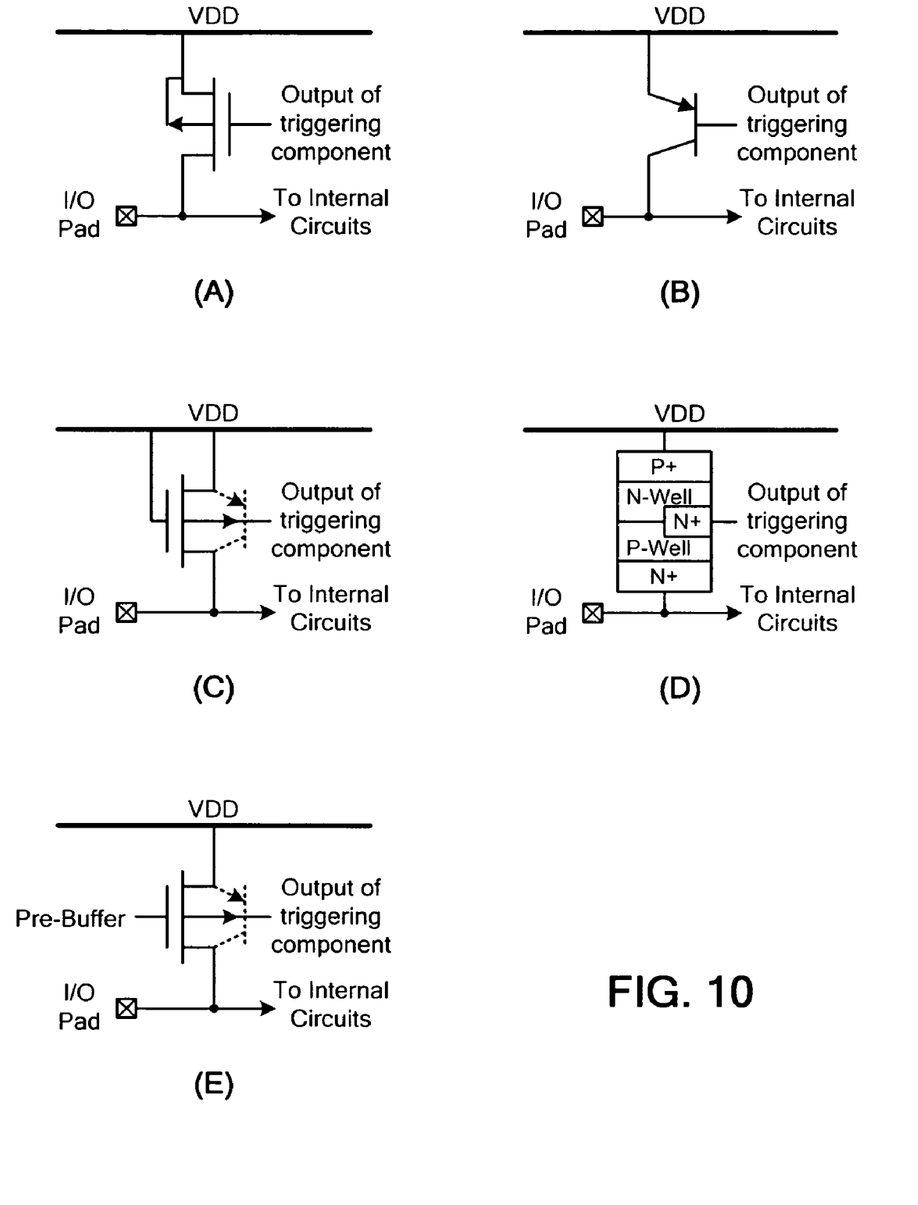
FIG. 10 illustrates several applicable examples of the discharging component coupled between an I/O pad and the VSS power rail.

FIG. 10 illustrates several applicable examples of the discharging component 82. In actual applications, the discharging component 82 can be a gate-driven PMOS in FIG. 10(A), a PNP BJT in FIG. 10(B), a gate-VDD PMOS in FIG. 10(C), a N-type substrate-triggered SCR in FIG. 10(D), or a PMOS with its gate terminal coupled to a pre-buffer in FIG. 10(E).

During normal power operations of the internal circuits 100, the discharging component 82 is turned off. Under NS-mode ESD stresses, the diode D1 is forward-biased to discharge ESD currents from the second power line to the input/output pad. On the other side, under ND-mode ESD stresses, the RC-delay of R1 and C1 turns on the PMOS of the inverter INV_3 and the NMOS of the inverter INV_2. Therefore, the discharging component 82 between the first power line and the input/output pad can be turned on by the output current or output voltage of the inverter INV_2.

In actual applications, the two inverters, INV_2 and INV_3, can be replaced by an M-input NAND plus an N-input NAND, an M-input NOR plus an N-input NOR, or an M-input NAND plus an N-input NOR. M and N are both positive integers larger than 1, respectively. According to the invention, the M or N inputs of the devices are coupled with each other.

Figure 11:
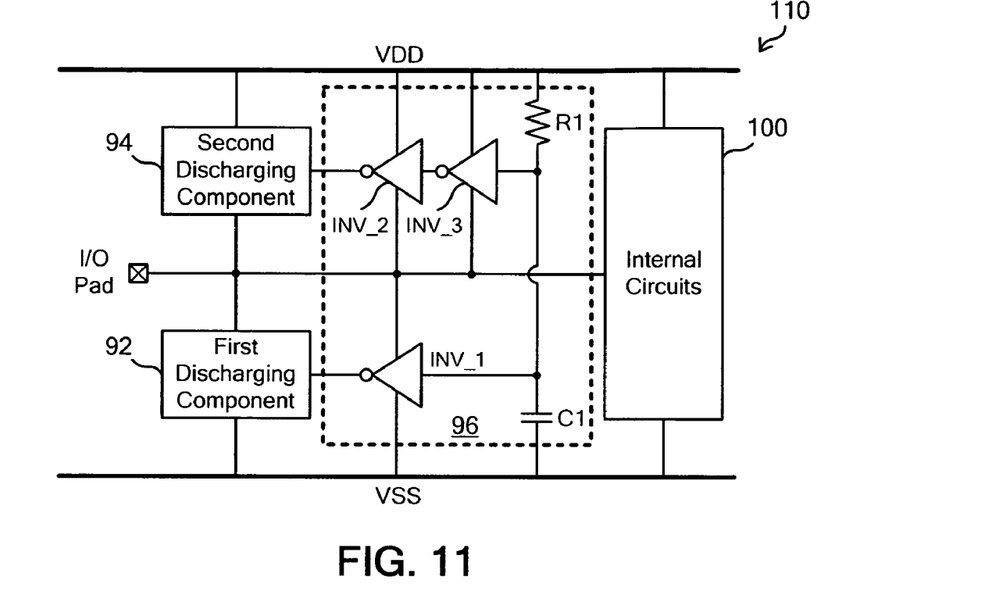
FIG. 11 illustrates the ESD protection circuit in the third embodiment according to the invention.

Please refer to FIG. 11, which illustrates the ESD protection circuit in the third embodiment according to the invention. In this embodiment, the circuits in FIG. 7 and FIG. 8 are combined to cope with all ESD conditions (PD-mode, PS-mode, ND-mode, and NS-mode).

As shown in FIG. 11, the ESD protection circuit 110 includes a first discharging component 92, a second discharging component 94, and an ESD detection circuit 96. The first discharging component 92 is coupled between an input/output pad and a first power line (VSS) of an IC. The second discharging component 94 is coupled between the input/output pad and a second power line (VDD) of the IC.

The ESD detection circuit 96 includes a capacitor C1, a resistor R1, and three inverters. The first inverter INV_1 has a first positive power end coupled to the input/output pad and a first negative power end coupled to the first power line. The input of the first inverter INV_1 is coupled to the node between the capacitor and the resistor. The second inverter INV_2 and the third inverter INV_3 respectively have a positive power end coupled to the second power line and a negative power end coupled to the input/output pad.

The first discharging component 92 can be one of the devices shown in FIG. 9; the second discharging component 94 can be one of the devices shown in FIG. 10. During normal power operations of the internal circuits 100, the first discharging component 92 and the second discharging component 94 are turned off. As described in the aforementioned embodiments, the three inverters are used for turning on the discharging components 92 and 94 in the ESD events.

Under PS-mode ESD stresses, the RC-delay of R1 and C1 turns on the PMOS in inverter INV_1 to turn on the first discharging component 92. Under ND-mode ESD stresses, the RC-delay of R1 and C1 turns on the PMOS in inverter INV_3 and the NMOS in inverter INV_2 to turn on the second discharging component 94. Under PD-mode ESD stresses, ESD currents can be conducted through the diode formed by the second discharging component 94. Under NS-mode ESD stresses, ESD currents can be conducted through the diode formed by the first discharging component 92.

For ESD protection of an output pad, the gate terminals of the MOSs in the inverters can be connected to a pre-buffer and act as a part of the output buffer. Besides, each inverter in this embodiment can be replaced by NAND or NOR with all inputs connected together.

Figure 12:
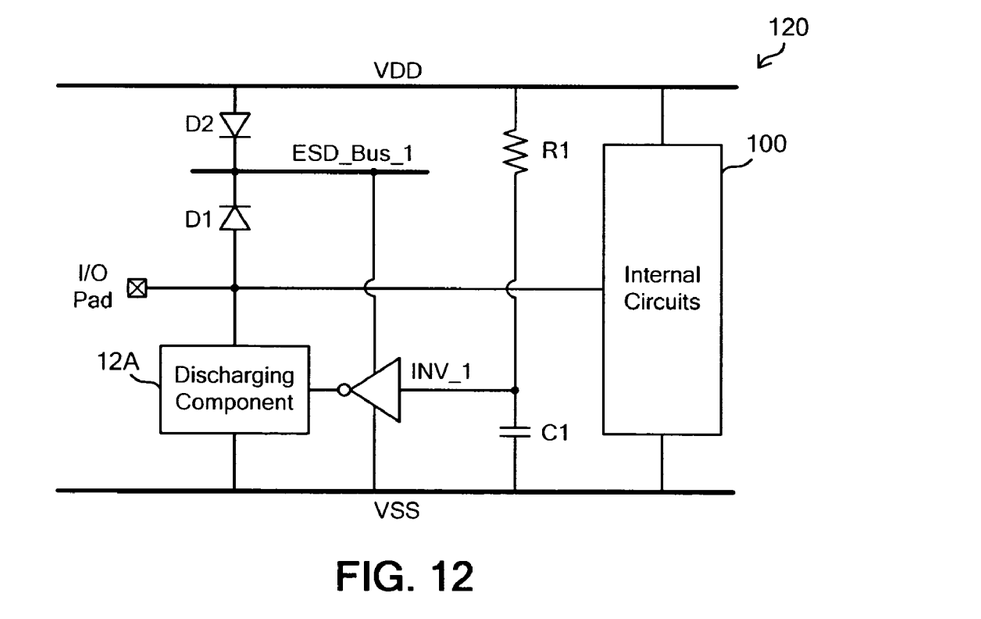
FIG. 12 illustrates the ESD protection circuit in the fourth embodiment according to the invention.

FIG. 12 illustrates the ESD protection circuit in the fourth embodiment according to the invention. In this embodiment, an ESD bus (ESD_Bus_1) is added between the VDD power rail and the input/output pad. With ESD_Bus_1, the coupling effects at VDD can be reduced when there is overshoot at the input/output pad. Further, in this embodiment, the power ends of the inverter INV_1 is connected to ESD_Bus_1 and VSS, so the parasitic effects of INV_1 are not contributed to the input/output pad. Thus, with ESD_Bus_1, this design is more suitable for analog or high-frequency applications.

As shown in FIG. 12, a diode D2 is coupled between ESD_Bus_1 and the VDD power rail in a forward direction toward ESD_Bus_1. The function of this diode is to prevent coupling from ESD_Bus_1 to VDD. The operations of the inverter INV_1, the discharging component 12A, the diode D1, the capacitor C1, and the resistor R1 are similar to those in the first embodiment above and not described again herein.

Figure 13:
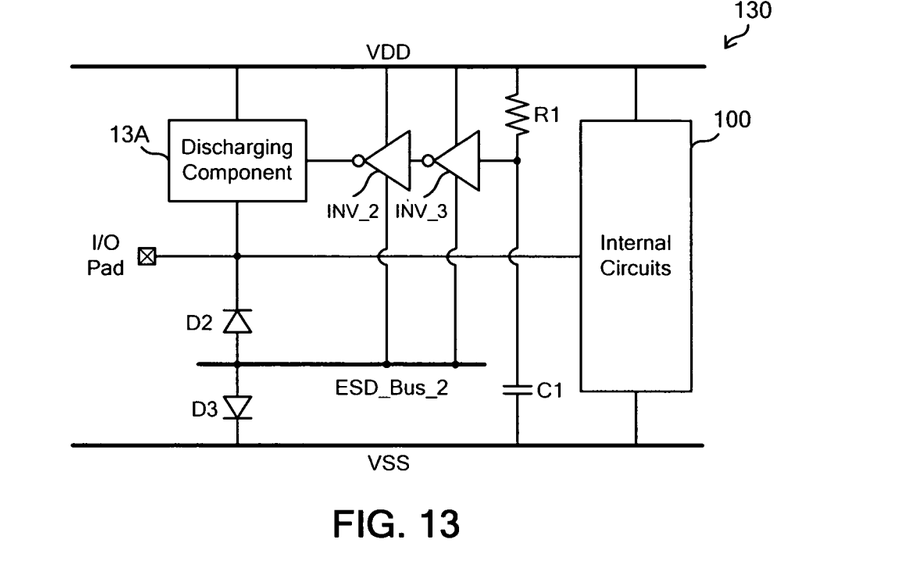
FIG. 13 illustrates the ESD protection circuit in the fifth embodiment according to the invention.

FIG. 13 illustrates the ESD protection circuit in the fifth embodiment according to the invention. In this embodiment, an ESD bus (ESD_Bus_2) is added between the VSS power rail and the input/output pad. With ESD_Bus_2, the coupling effects at VSS can be reduced when there is undershoot at the input/output pad. Besides, the inverters, INV_2 and INV_3, are connected between VDD and ESD_Bus_2, so the parasitic effects of the inverters are not contributed to the input/output pad.

As shown in FIG. 13, a diode D3 is coupled between ESD_Bus_2 and the VSS power rail in a forward direction toward ESD_Bus_2. The function of this diode is to prevent coupling from ESD_Bus_2 to VSS. The operations of the inverters, the discharging component 13A, the diode D2, the capacitor C1, and the resistor R1 are similar to those in the second embodiment above and not described again herein.

Figure 14:
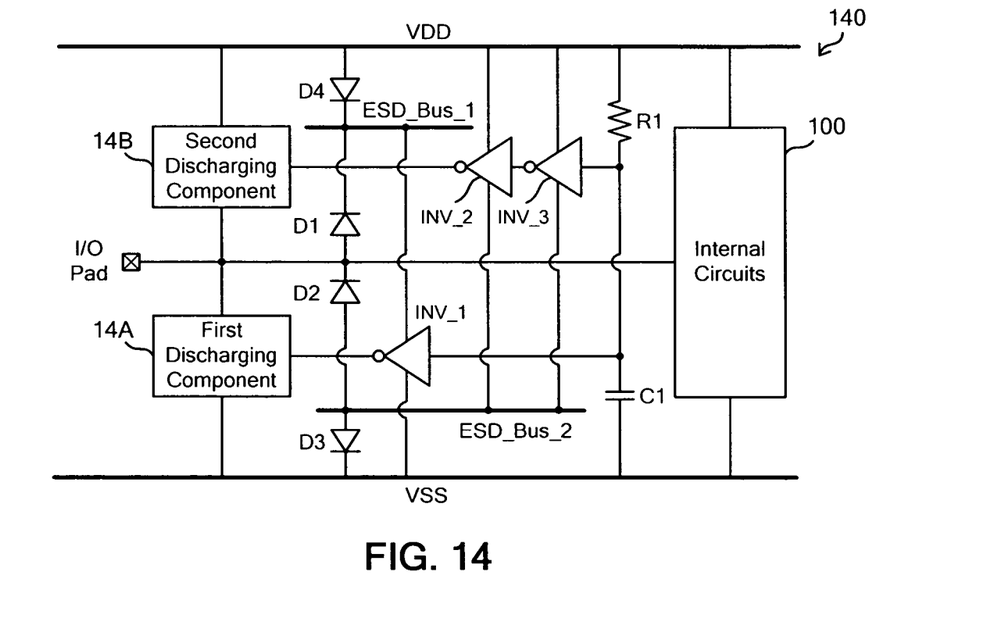
FIG. 14 illustrates the ESD protection circuit in the sixth embodiment according to the invention.

FIG. 14 illustrates the ESD protection circuit in the sixth embodiment according to the invention. In this embodiment, an ESD bus (ESD_Bus_1) is added between the VDD power rail and the input/output pad, and another ESD bus (ESD_Bus_2) is added between the VSS power rail and the input/output pad. With the two buses, the coupling effects induced by overshoot or undershoot at the I/O pad are reduced.

The operations of the inverters (INV_1~INV_3), the discharging components (14A and 14B), the diodes (D1~D4), the capacitor C1, and the resistor R1 are similar to those in the embodiments above and not described again herein. Similarly, each of the inverters in FIG. 12~FIG. 14 can respectively be replaced by NAND or NOR with all inputs connected together.

In this invention, several new ESD detection circuits are proposed. The circuits can effectively provide trigger current to turn on discharging components when an integrated circuit is under ESD stresses. Furthermore, the proposed ESD bus in this invention can reduce the coupling effects between input/output pads and VDD or VSS power rails when there is overshoot or undershoot at input/output pads.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An electrostatic discharge (ESD) protection circuit, comprising:
    a discharging component, coupled between an input/output pad and a first power line of an IC;
    a first diode coupled between the input/output pad and an ESD bus in a forward direction toward the ESD bus;
    a second diode coupled between the ESD bus and a second power line of the IC in a forward direction toward the ESD bus; and
    an ESD detection circuit, comprising:
        a capacitor and a resistor formed in series and coupled between the first power line and the second power line; and
        a triggering component, having a positive power end coupled to the ESD bus and a negative power end coupled to the first power line; an input of the triggering component being coupled to a node between the capacitor and the resistor;
    wherein the discharging component is turned off during normal power operations, and triggered by a output of the triggering component in an ESD event.

2. The ESD protection circuit of claim 1, wherein the discharging component is a gate-driven NMOS, a gate-grounded NMOS, an NMOS with its gate terminal coupled to a pre-buffer, an NPN BJT, or a P-type substrate-triggered SCR.

3. The ESD protection circuit of claim 1, wherein the triggering component is an inverter, an M-input NAND with all inputs coupled together, or an N-input NOR with all inputs coupled together, M and N are positive integers larger than 1, respectively.

* * * * *